United States Patent
Hudson et al.

(10) Patent No.: US 10,578,678 B1
(45) Date of Patent: Mar. 3, 2020

(54) SYSTEM AND METHOD FOR DETECTING DEGRADATION OF POWER SOURCE IN VEHICLES

(71) Applicant: Ford Global Technologies, LLC, Dearborn, MI (US)

(72) Inventors: Andrew Hudson, Sterling Heights, MI (US); David Celinske, Wolverine Lake, MI (US); John Anthony DeMarco, Lake Orion, MI (US); Farouq Mozip, Dearborn, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 0 days.

(21) Appl. No.: 16/291,848

(22) Filed: Mar. 4, 2019

(51) Int. Cl.
| | | |
|---|---|---|
| G08B 21/00 | (2006.01) | |
| G01R 31/392 | (2019.01) | |
| G01R 19/165 | (2006.01) | |
| G01R 31/00 | (2006.01) | |
| G01R 31/388 | (2019.01) | |
| G01R 31/374 | (2019.01) | |
| G01R 31/3835 | (2019.01) | |
| G01R 31/379 | (2019.01) | |

(52) U.S. Cl.
CPC ..... *G01R 31/392* (2019.01); *G01R 19/16542* (2013.01); *G01R 31/007* (2013.01); *G01R 31/374* (2019.01); *G01R 31/379* (2019.01); *G01R 31/388* (2019.01); *G01R 31/3835* (2019.01)

(58) Field of Classification Search
CPC ...... B60L 58/16; G01R 31/392; H02J 7/0008; H02J 7/1461; H02J 7/00; B60W 20/13
See application file for complete search history.

(56) References Cited

U.S. PATENT DOCUMENTS

| | | | |
|---|---|---|---|
| 6,275,161 B1 | 8/2001 | Wan et al. | |
| 6,862,504 B2 | 3/2005 | Hamdan et al. | |
| 7,817,051 B2 | 10/2010 | Cheng et al. | |
| 7,969,756 B1 | 6/2011 | Wu | |
| 2003/0169018 A1* | 9/2003 | Berels | H02J 1/14 320/132 |
| 2015/0268307 A1* | 9/2015 | Inguva | B60L 58/16 702/63 |

FOREIGN PATENT DOCUMENTS

| | | |
|---|---|---|
| DE | 10309913 B3 | 8/2004 |
| JP | 2017078600 A | 4/1917 |

* cited by examiner

*Primary Examiner* — Toan N Pham
(74) *Attorney, Agent, or Firm* — Frank Lollo; Eversheds Sutherland (US) LLP

(57) ABSTRACT

A vehicle includes an electric power converter, a power source, a detection circuit, at least one processor, and at least one memory. The electric power converter filters voltage ripple generated by the electric power converter. The detection circuit determines an unfiltered measurement of the power source and a filtered measurement of the power source and generates a differential signal by comparing the unfiltered measurement and the filtered measurement. Said memory stores instructions executable by said processor. The instructions causes said processor to determine a state of health of the power source based at least in part on the differential signal.

20 Claims, 5 Drawing Sheets

SYSTEM AND METHOD FOR DETECTING DEGRADATION OF POWER SOURCE IN VEHICLES

TECHNICAL FIELD

The present disclosure generally relates to a system and method for detecting degradation of power source in vehicles and, more specifically, a system and method for detecting degradation of 12V sealed lead acid (SLA) batteries in hybrid or electric vehicles.

BACKGROUND

Vehicles utilize a stop-start feature for reducing fuel consumption and emission. Generally, these vehicles include a 12V SLA battery for supplying power to restart the engine and are equipped with a sensor coupled to the SLA battery for monitoring the health of the 12V SLA battery. The sensor relies on a high current pulse created by a starter motor to monitor the characteristics of the 12V SLA battery. As modern vehicle systems are forgoing traditional starter motors in lieu of higher voltage starting systems, the traditional 12V battery sensors are starved of the high current pulses necessary to determine the battery health.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

An example vehicle, method, and circuit are described. The example vehicle includes an electric power converter, a power source, a detection circuit, at least one processor, and at least one memory. The electric power converter filters voltage ripple generated by the electric power converter. The detection circuit determines an unfiltered measurement of the power source and a filtered measurement of the power source and generates a differential signal by comparing the unfiltered measurement and the filtered measurement. Said memory stores instructions executable by said processor. The instructions causes said processor to determine a state of health of the power source based at least in part on the differential signal.

The example method includes determining an unfiltered measurement of a power source and a filtered measurement of the power source, wherein the power source is electrically coupled to an electric power converter and filters voltage rippled generated by the electric power converter, generating a differential signal by comparing the unfiltered measurement and the filtered measurement, and determining a state of health of the power source based at least in part on the differential signal.

The example circuit includes an electric power converter, a power source, a detection circuit, at least one processor, and at least one memory. The electric power converter filters voltage ripple generated by the electric power converter. The detection circuit determines an unfiltered measurement of the power source and a filtered measurement of the power source and generates a differential signal by comparing the unfiltered measurement and the filtered measurement. Said memory stores instructions executable by said processor. The instructions causes said processor to determine a state of health of the power source based at least in part on the differential signal.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
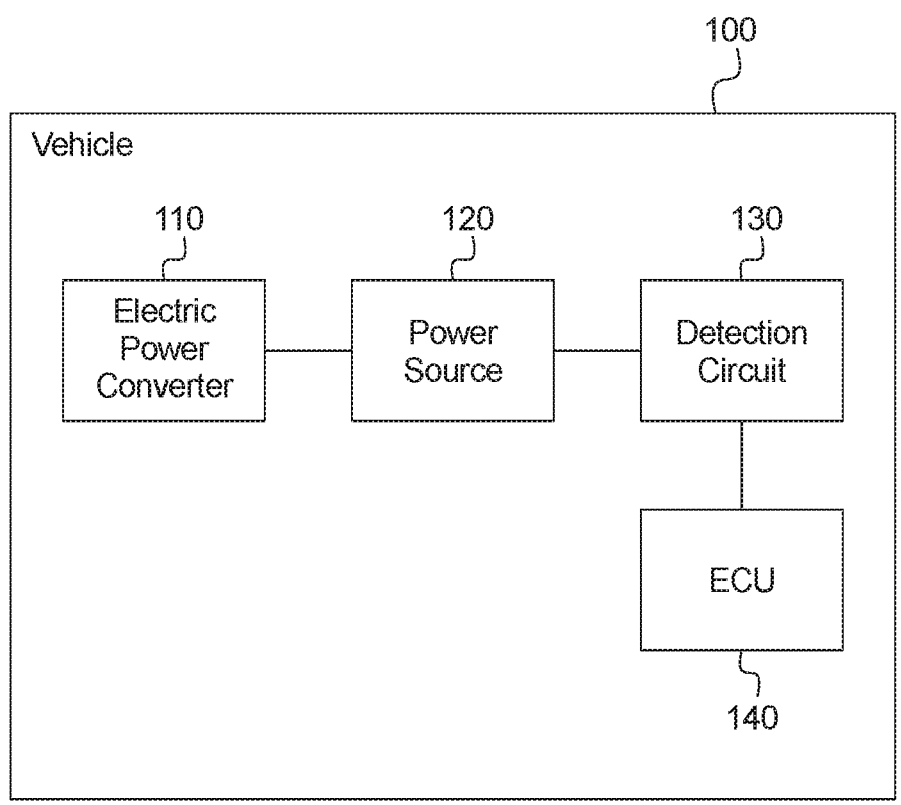
FIG. 1 illustrates a vehicle in accordance with this disclosure.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Vehicle power systems account for frequent discharge of power, which is particularly applicable in vehicles including a stop-start system. The stop-start system automatically shuts down and restarts the vehicle's internal combustion engine to reduce the total amount of time that the engine spends idling, thereby reducing fuel consumption and emission. These vehicles typically include 12V SLA battery for supplying power to restart the engine and are equipped with a sensor coupled to the SLA battery that measures current, voltage, and temperature to calculate various battery state parameters. One of these parameters is battery health. The sensor relies on a high current pulse created by a starter motor to measure the internal resistance of the battery. This internal resistance is compared to a table of values that are variable with respect to battery temperature to determine whether the battery is in good health or is in need of replacement. As automakers are moving towards fully electric and hybrid electric powertrains, modern vehicle systems are forgoing traditional starter motors in lieu of higher voltage starting systems. By doing so, the traditional 12V battery sensors are starved of the high current pulses necessary to determine battery health.

As disclosed herein, a vehicle includes an electric power converter, a power source, and a detection circuit. The electric power converter may be a DC-to-DC converter. A DC-to-DC converter is a device that converts high voltage electrical energy (e.g., ~300-400V) to low voltage electrical energy (e.g., ~12-15V) or vice-versa. The electric power converter is electrically coupled to the power source. The power source may be a 12V SLA battery. The power source filters the voltage ripple existing within the vehicle electrical systems caused by the DC-to-DC converter. The detection circuit is electrically coupled to the power source. The detection circuit: (1) takes raw, unfiltered measurements of the power source; (2) takes heavily filtered measurements of the power source; (3) generates a differential signal by amplifying the difference between the raw, unfiltered measurements and the filtered measurements; and (4) determines the battery health of the power source based on the differential signal.

FIG. 1 illustrates the vehicle 100 in accordance with this disclosure. The vehicle 100 may be a standard gasoline powered vehicle, a hybrid vehicle, an electric vehicle, a fuel cell vehicle, and/or any other mobility implement type of vehicle. The vehicle 100 may be a semi-autonomous vehicle (e.g., some routine motive functions, such as parking, are controlled by the vehicle), or an autonomous vehicle (e.g., motive functions are controlled by the vehicle without direct driver input). The vehicle 100 includes an electric power converter 110, a power source 120, a detection circuit 130, and an electronic control unit (ECU) 140. These devices may be electrically coupled to each other via one or more wires, a power bus, a communication bus, or any combination thereof.

The electric power converter 110 may be a DC-to-DC converter. As mentioned above, a DC-to-DC converter is a device that converts high voltage electrical energy (e.g., ~300-400V) to low voltage electrical energy (e.g., ~12-15V) or vice-versa. The functional duties of a DC-to-DC converter may be similar to that of a conventional alternator within a vehicle system in that the DC-to-DC converter may operate to charge the power source 120 as well as source the energy needed to power the vehicle system.

The power source 120 may be a 12V SLA battery. The power source 120 is electrically coupled to the electric power converter 110 and filters the voltage ripple generated by the electric power converter 110.

The detection circuit 130 is electrically coupled to the power source 120 and is operable to measure a filtering capability of the power source 120. Specifically, the detection circuit 130 determine the filtering capability based on an internal resistance of the power source 120. To determine the internal resistance, the detection circuit 130: (1) takes raw, unfiltered measurements of the power source 120; (2) takes heavily filtered measurements of the power source 120; and (3) generates a differential signal by amplifying the difference between the raw, unfiltered measurements and the filtered measurements. The differential signal may be transmitted to the ECU 140 for further analysis.

The ECU 140 may be defined by or included within a power train control module (PCM), a body control module (BCM), and/or other vehicle modules. In some examples, the ECU 140 may be defined as its own module and/or be separate from the modules described above. The ECU 140 includes at least one processor or controller 142 and at least one memory 144. The ECU 140 may operate to execute computer-executable instructions stored in said memory 144. Said computer-executable instructions may be compiled or interpreted from computer programs created using a variety of programming languages and/or technologies, including, without limitation and either alone or in combination, assembly, Java, C, C++, C #, Objective C, Fortran, Pascal, Java Script, Python, Perl, and PL/SQL.

The processor or controller 142 may be any suitable processing device or set of processing devices such as, but not limited to: a microprocessor, a microcontroller-based platform, a suitable integrated circuit, one or more field programmable gate arrays (FPGAs), and/or one or more application-specific integrated circuits (ASICs). The memory 144 may be volatile memory (e.g., RAM, which can include non-volatile RAM, magnetic RAM, ferroelectric RAM, and any other suitable forms); non-volatile memory (e.g., disk memory, FLASH memory, EPROMs, EEPROMs, non-volatile solid-state memory, etc.), unalterable memory (e.g., EPROMs), read-only memory, and/or high-capacity storage devices (e.g., hard drives, solid state drives, etc). In some examples, the memory 144 includes multiple kinds of memory, particularly volatile memory and non-volatile memory. The memory 144 is computer readable media on which one or more sets of instructions, such as the software for operating the methods of the present disclosure can be embedded. The instructions may embody one or more of the methods or logic as described herein. In a particular embodiment, the instructions may reside completely, or at least partially, within any one or more of the memory 144, the computer readable medium, and/or within the processor during execution of the instructions.

The terms "non-transitory computer-readable medium" and "tangible computer-readable medium" should be understood to include a single medium or multiple media, such as a centralized or distributed database, and/or associated caches and servers that store one or more sets of instructions. The terms "non-transitory computer-readable medium" and "tangible computer-readable medium" also include any tangible medium that is capable of storing, encoding or carrying a set of instructions for execution by a processor or that cause a system to perform any one or more of the methods or operations disclosed herein. As used herein, the term "tangible computer readable medium" is expressly defined to include any type of computer readable storage device and/or storage disk and to exclude propagating signals.

The ECU 140 receives the differential signal from the detection circuit 130 and compares the differential signal to one or more reference values. Each of said reference values may correspond to a quantitative value representative of a certain degree of battery health. In some examples, the reference values may be voltages, and the voltages may correspond to a range of battery health. The degree of the battery health may be determined by comparing the voltage of the differential signal to that of the reference values. For example, the differential signal at 0 V may correspond to 100% battery health, the differential signal at 1 V may correspond to 50% battery health, etc. In alternative examples, the detection circuit 130 may convert the differential signal to a pulse width modulation (PWM) signal. In such examples, the magnitude of the voltage level of the differential signal corresponds to that of the duty cycle of the PWM signal. In such examples, the reference values may be duty cycles, and the duty cycles may correspond to a range of battery health. In such examples, the degree of the battery health may be determined by comparing the duty cycle of the PWM signal to that of the reference values. The ECU 140 may determine the degree of battery health based on the magnitude of the duty cycle of the PWM signal. For example, a PWM signal having 0% duty cycle may correspond to 100% battery health, a PWM signal having 50% duty cycle may correspond to 50% battery health, etc. While the above examples demonstrate the correlation between the voltage of the differential signal and the battery health and the correlation between the duty cycle of the PWM signal and the battery health as having an inverse relationship, it should be appreciated that, in some examples, said correlations may be represented as a direct relationship. In some examples, the power source 120 may be further coupled to sensors (not illustrated) for detecting the temperature and the state of charge (SoC) of the power source 120. In such examples, the ECU 140 may determine the battery health based on the temperature and/or the SoC of the power source 120 in addition to the differential signal. Since the internal resistance of the power source 120 varies based on the temperature and the SoC of the power source 120, the ECU 140 may adjust the reference values based on the temperature and the SoC of the power source 120. For example, if the temperature of the power source 120 decreases, the ECU 140 may raise the reference values prior to comparing the differential signal to the reference values.

Figure 2:
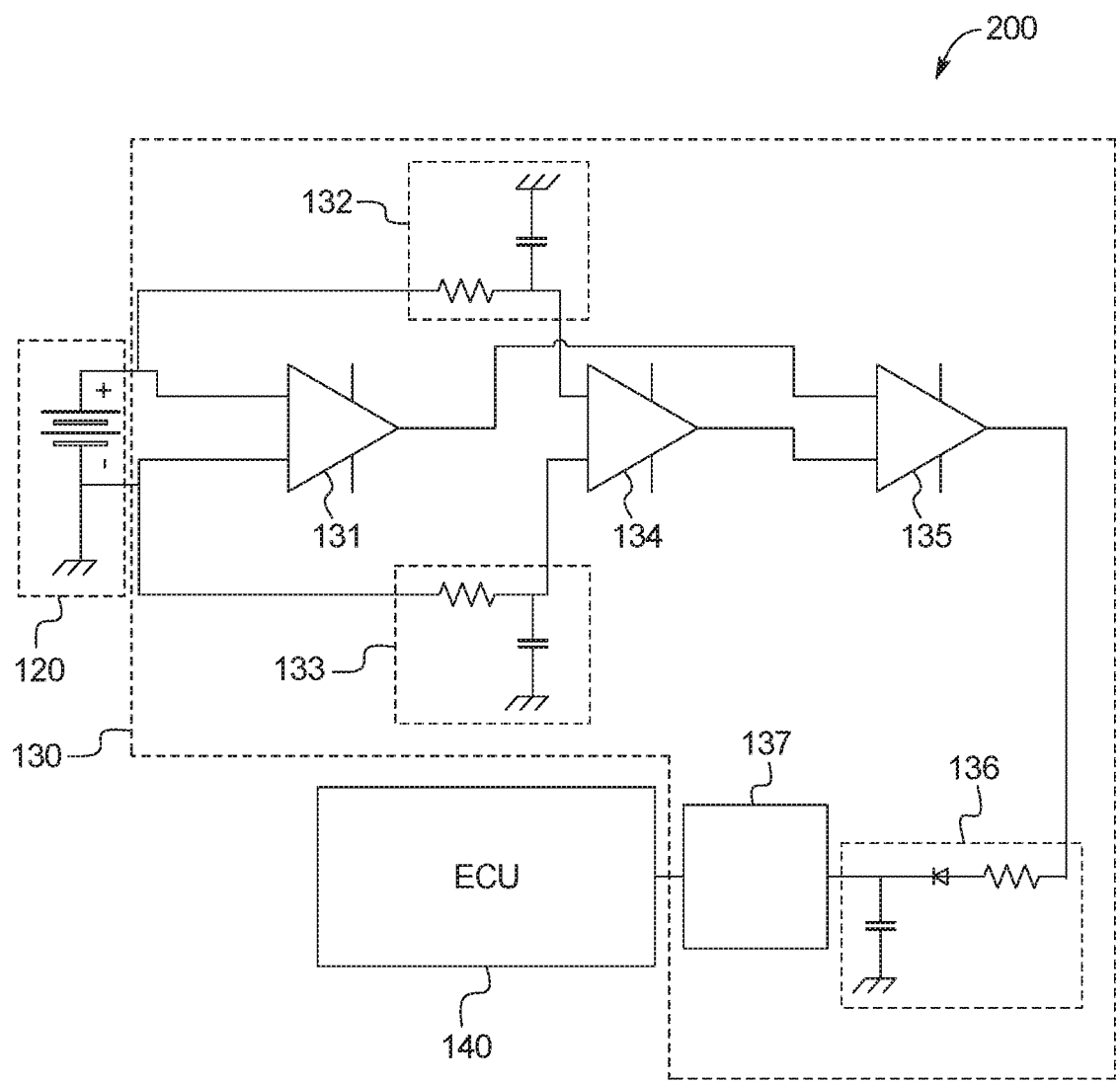
FIG. 2 illustrates a detailed view of certain components within the vehicle of FIG. 1.

FIG. 2 illustrates the detailed view of certain components within the vehicle of FIG. 1. It should be appreciated that the structure, the orientation, and/or the design of said components described with reference to FIG. 2 are non-limiting, and many variations and modifications may be made to this example embodiment without substantially departing from the overall scope of the invention. In the illustrated example, the detailed view includes the circuit schematics of the power source 120 and the detection circuit 130.

The detection circuit 130 includes a first differential amplifier 131, a first filter 132, a second filter 133, a second differential amplifier 134, a third differential amplifier 135, a third filter 136, and an analog to digital converter (ADC) 137. Each of the first to third differential amplifiers 131, 134, and 135 include two inputs and an output. In some example, the first to third differential amplifiers 131, 134, and 135 may be identical to each other. The two inputs of the first differential amplifier 131 is electrically coupled to a positive terminal of the power source 120 and the a negative terminal of the power source 120. The first differential amplifier 131 determines the raw, unfiltered measurements of the power source 120 by amplifying the potential difference between the positive terminal and the negative terminal of the power source 120. The positive terminal and the negative terminal of the power source 120 are further electrically coupled to the first filter 132 and the second filter 133, respectively. The first filter 132 and the second filter 133 may be low pass filters. In some examples, the first filter 132 and the second filter 133 may be identical filters. In some examples, each of the first filter 132 and the second filter 133 includes a capacitor and a resistor electrically coupled in parallel. The first filter 132 and the second filter 133 are further electrically coupled to the two inputs of second differential amplifier 134, respectively. The second differential amplifier 134 determines the filtered measurements of the power source 120 by amplifying the potential difference between an output terminal of the first filter 132 and an output terminal of the second filter 133. The outputs of the first differential amplifier 131 and the second differential amplifier 134 are electrically coupled to the two inputs of the third differential amplifier 135, respectively. The third differential amplifier 135 amplifies the potential difference between the output of the first differential amplifier 131 and the output of the second differential amplifier 134. The third differential amplifier 135 subtracts the DC offset from the ripple voltage. The output of the third differential amplifier 135 is electrically coupled to the third filter 136. The third filter 136 include a resistor, a diode electrically coupled with the resistor in series, and a capacitor electrically coupled with the diode in parallel. The diode prevents the output voltage of the third filter 136 to reverse in polarity. The input of the third filter 136 may be defined at a node connecting the resistor and the output of the third differential amplifier 135 and the output of the third filter 136 may be defined by a node connecting the capacitor and the diode. The third filter 136 is further electrically coupled to the ADC 137. The ADC 137 converts the analog output voltage of the third filter 136 to a digital signal (i.e., PWM signal) by correlating the rate of the analog output voltage to the magnitude of duty cycle of the digital signal. The ADC 137 is further electrically coupled to the ECU 140. In alternative examples, the detection circuit 130 may exclude the ADC 137, and the output of the third filter 136 may be directly connected to the ECU 140.

Figure 3A:
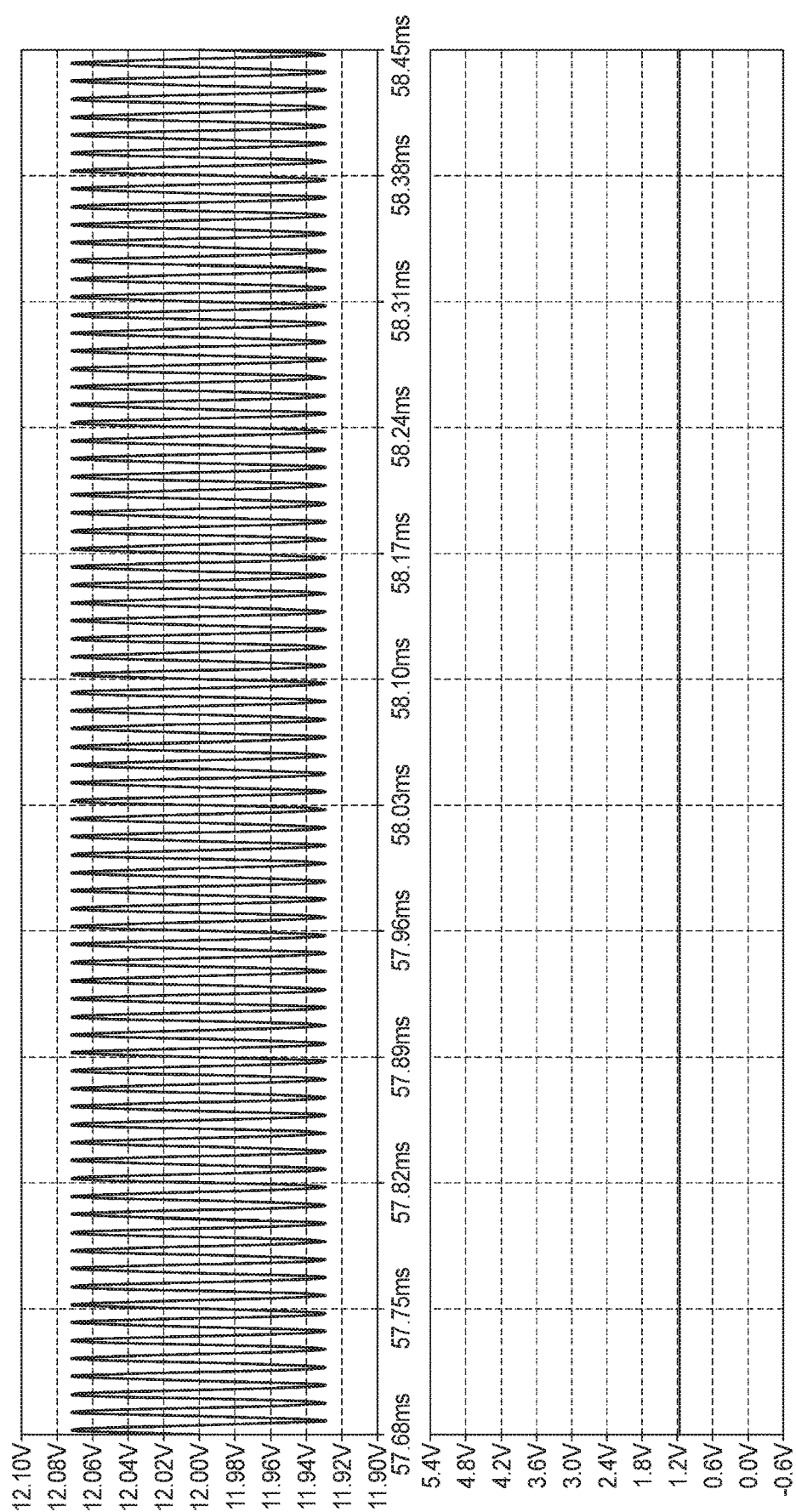
FIGS. 3A and 3B illustrate examples graphs demonstrating a relationship between the voltage level of a differential signal and a voltage ripple.
Figure 3B:
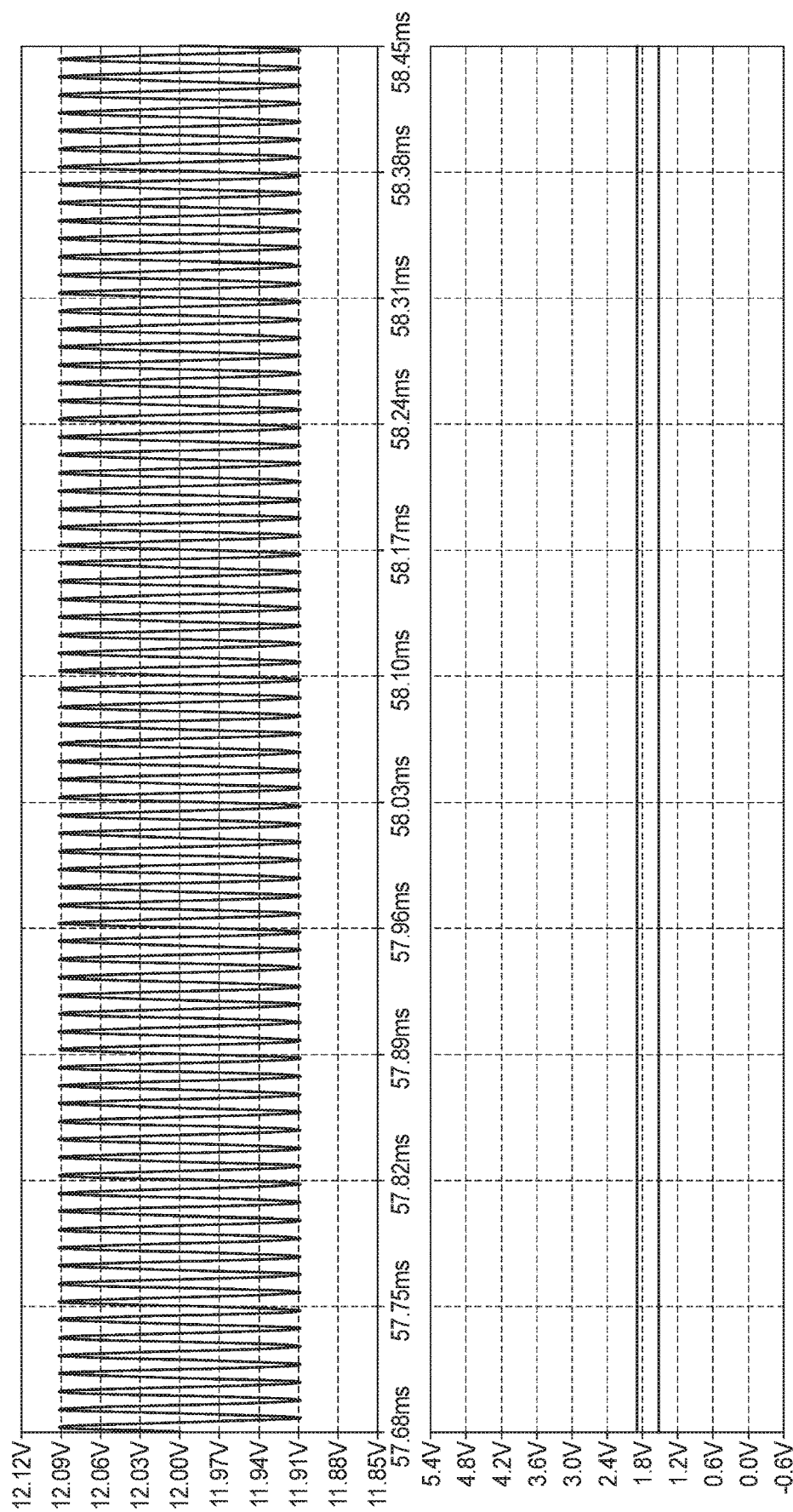

FIGS. 3A and 3B illustrate the examples graphs demonstrating the relationship between the voltage level of the differential signal and the voltage ripple.

In FIG. 3A, the top graph illustrates an example voltage ripple detected at the power source 120, and the bottom graph illustrates an example differential signal output at the third differential amplifier 135. FIG. 3A represents a new, healthy power source 120 being charged by electric power converter 110 at a temperature of 20 degree Celsius. In the top graph, the example voltage ripple is generated at 100 $mV_{peak-to-peak}$ at 100 kHz. In the bottom graph, the example differential signal is generated at approximately 1.2V.

In FIG. 3B, the top graph illustrates an example voltage ripple detected at the power source 120, and the bottom graph illustrates an example differential signal output at the third differential amplifier 135. FIG. 3B represents an old, unhealthy power source 120 being charged by electric power converter 110 at a temperature of 20 degree Celsius. In the top graph, the example voltage ripple is generated at 200 $mV_{peak-to-peak}$ at 100 kHz. In the bottom graph, the example differential signal is generated at approximately 1.5V.

It should be appreciated that the numerical values presented in these example graphs are merely provided for demonstrative purposes, and the actual values of the voltage ripple generated at the power source 120 and the differential signal output at the third differential amplifier 135 may vary depending on the type, temperature, state of charge of the power source 120, the structure, the orientation, and/or the design of the detection circuit 130, and/or other relevant factors.

Figure 4:
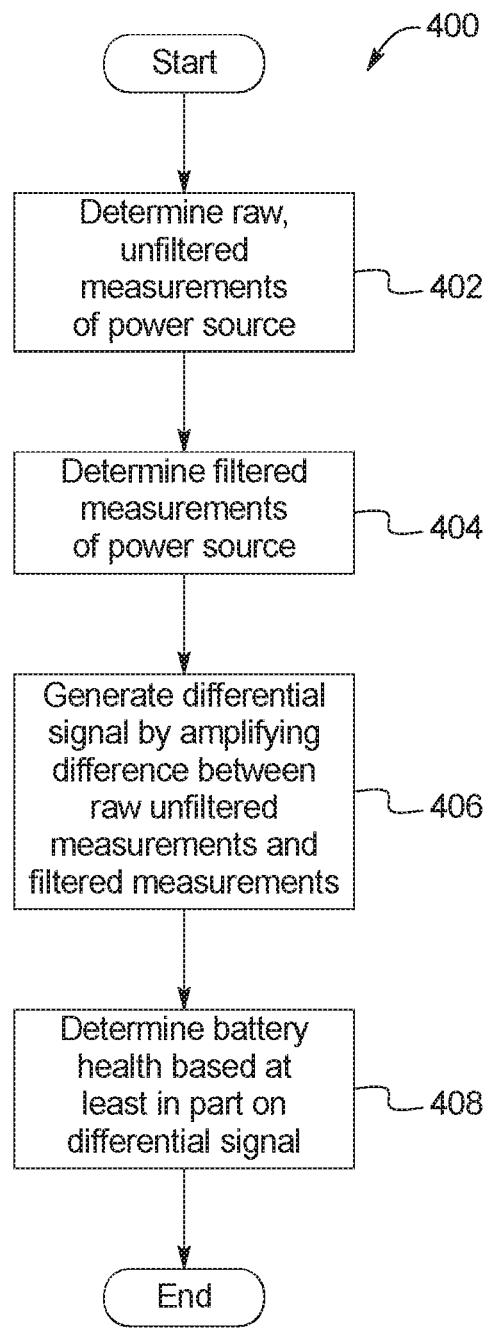
FIG. 4 illustrates a flowchart of a method for determining the battery health of a power source of the vehicle of FIG. 1.

FIG. 4 illustrates a flowchart 400 of a method for determining the battery health of the power source 120 of the vehicle of FIG. 1. The method may be carried out by the detection circuit 130 and the ECU 140 of FIG. 1.

At block 402, the detection circuit 130 determines the raw, unfiltered measurements of the power source 120 by amplifying the potential difference between the positive terminal and the negative terminal of the power source 120.

At block 404, the detection circuit 130 determines the filtered measurements of the power source 120 by amplifying the potential difference between the output terminal of the first filter 132 and the output terminal of the second filter 133.

At block 406, the detection circuit 130 generates the differential signal by amplifying the difference between the raw, unfiltered measurements of the power source 120 and the filtered measurements of the power source 120. At this time the detection circuit 130 may further convert the differential signal to the PWM signal.

At block 408, the ECU 140 compares the differential signal (or the PWM signal) to one or more reference values and determines the degree of battery health based on the comparison.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects.

Further, the conjunction "or" may be used to convey features that are simultaneously present instead of mutually exclusive alternatives. In other words, the conjunction "or" should be understood to include "and/or". As used here, the terms "module" and "unit" refer to hardware with circuitry to provide communication, control and/or monitoring capabilities, often in conjunction with sensors. "Modules" and "units" may also include firmware that executes on the circuitry. The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
   an electric power converter;
   a power source configured to filter voltage ripple generated by the electric power converter;
   a detection circuit configured to:
     determine an unfiltered measurement of the power source and a filtered measurement of the power source; and
     generate a differential signal by comparing the unfiltered measurement and the filtered measurement;
   at least one processor; and
   at least one memory storing instructions executable by said processor, the instructions causing said processor to determine a state of health of the power source based at least in part on the differential signal.

2. The vehicle of claim 1, wherein the electric power converter is a DC-to-DC converter.

3. The vehicle of claim 1, wherein the power source is a 12V sealed lead acid (SLA) battery.

4. The vehicle of claim 1, wherein the electric power converter function as a vehicle alternator.

5. The vehicle of claim 1, wherein the detection circuit comprises:
   a first amplifier electrically coupled to the power source;
   a second amplifier electrically coupled to the power source via first filters; and
   a third amplifier configured to generate the differential signal based on voltages output from the first amplifier and the second amplifier.

6. The vehicle of claim 5, wherein the instructions further causes said processor to determine the state of health of the power source by comparing a voltage level of the differential signal to one or more reference values.

7. The vehicle of claim 1, wherein the detection circuit further comprises an analog to digital converter (ADC) configured to convert the differential signal to a pulse width modulation (PWM) signal having a duty cycle.

8. The vehicle of claim 7, wherein the instructions further causes said processor to determine the state of health of the power source by comparing the duty cycle to one or more reference values.

9. The vehicle of claim 1, further comprising at least one sensor for determining a temperature of the power source or a state of charge (SoC) of the power source, wherein the instructions further causes said processor to determine the state of health of the power source based on the temperature of the power source or the SoC of the power source.

10. The vehicle of claim 9, wherein the instructions further causes said processor to:
    adjust one or more reference values based on the temperature of the power source or the SoC of the power source; and
    determine the state of health of the power source by comparing the differential signal to said reference values.

11. A method comprising:
    determining an unfiltered measurement of a power source and a filtered measurement of the power source, wherein the power source is electrically coupled to an electric power converter, the power source filtering voltage ripple generated by the electric power converter;
    generating a differential signal by comparing the unfiltered measurement and the filtered measurement; and
    determining a state of health of the power source based at least in part on the differential signal.

12. The method of claim 11, wherein the electric power converter is a DC-to-DC converter.

13. The method of claim 11, wherein the power source is a 12V sealed lead acid (SLA) battery.

14. The method of claim 11, wherein the electric power converter function as a vehicle alternator.

15. The method of claim 11, further comprising determining the state of health of the power source by comparing a voltage level of the differential signal to one or more reference values.

16. The method of claim 11, further comprising converting the differential signal to a pulse width modulation (PWM) signal having a duty cycle.

17. The method of claim 16, further comprising determining the state of health of the power source by comparing the duty cycle to one or more reference values.

18. The method of claim 11, further comprising determining the state of health of the power source based on a temperature of the power source or a state of charge (SoC) of the power source.

19. The method of claim 18, further comprising:
    adjusting one or more reference values based on the temperature of the power source or the SoC of the power source; and
    determining the state of health of the power source by comparing the differential signal to said reference values.

20. A circuit comprising:
    an electric power converter;
    a power source configured to filter voltage ripple generated by the electric power converter;
    a detection circuit configured:
    determine an unfiltered measurement of the power source and a filtered measurement of the power source; and
    generate a differential signal by comparing the unfiltered measurement and the filtered measurement;
    at least one processor; and
    at least one memory storing instructions executable by said processor, the instructions causing said processor to determine a state of health of the power source based at least in part on the differential signal.

* * * * *